United States Patent
Read et al.

(10) Patent No.: US 9,929,213 B2
(45) Date of Patent: Mar. 27, 2018

(54) NANO-PARTICLE MATRIX FOR 3D NVM RRAM

(71) Applicant: HGST Netherlands B.V., Amsterdam (NL)

(72) Inventors: John C. Read, San Jose, CA (US); Kurt Allan Rubin, San Jose, CA (US)

(73) Assignee: Western Digital Technologies, Inc., San Jose, CA (US)

(*) Notice: Subject to any disclaimer, the term of this patent is extended or adjusted under 35 U.S.C. 154(b) by 123 days.

(21) Appl. No.: 15/007,965

(22) Filed: Jan. 27, 2016

(65) Prior Publication Data
US 2017/0213869 A1    Jul. 27, 2017

(51) Int. Cl.
*H01L 27/24* (2006.01)
*H01L 45/00* (2006.01)

(52) U.S. Cl.
CPC .......... *H01L 27/249* (2013.01); *H01L 45/085* (2013.01); *H01L 45/1233* (2013.01); *H01L 45/1266* (2013.01); *H01L 45/145* (2013.01); *H01L 45/1616* (2013.01)

(58) Field of Classification Search
CPC ... H01L 45/145; H01L 27/249; H01L 45/085; H01L 45/1233; H01L 45/1266; H01L 45/1616
See application file for complete search history.

(56) References Cited

U.S. PATENT DOCUMENTS

| 7,292,334 B1 | 11/2007 | Bratkovski et al. |
| 8,599,601 B2 | 12/2013 | Jo et al. |
| 8,685,291 B2 | 4/2014 | Schell et al. |
| 8,877,586 B2 | 11/2014 | Kai et al. |
| 8,947,908 B2 | 2/2015 | Jo |
| 9,165,979 B2* | 10/2015 | Tran ................. B82Y 10/00 |
| 9,691,821 B2* | 6/2017 | Bateman ............ H01L 27/2454 |
| 2008/0191177 A1 | 8/2008 | Mainwaring et al. |
| 2009/0188557 A1* | 7/2009 | Wang ................ H01L 31/02168 136/256 |
| 2010/0108972 A1* | 5/2010 | Zhao .................. B82Y 10/00 257/2 |
| 2010/0221896 A1 | 9/2010 | Sandoval |
| 2011/0168256 A1* | 7/2011 | Wang ............ H01L 31/035227 136/258 |
| 2011/0186799 A1 | 8/2011 | Kai et al. |

(Continued)

OTHER PUBLICATIONS

Lee et al, "Nucleation-Controlled Growth of Nanoparticles by Atomic Layer Deposition", 2012, Chem. Mater. 24, 4051-4059.*

(Continued)

*Primary Examiner* — Joseph C Nicely
(74) *Attorney, Agent, or Firm* — Patterson + Sheridan, LLP; Steven H. VerSteeg (57) ABSTRACT

The present disclosure generally relates to a nano-particle matrix in a 3D NVM RRAM device. The RRAM device utilizes a material that may be deposited into high aspect ratio channels, has good cycle ability, short erase and write times, and write/erase voltages that are compatible with CMOS. The RRAM material is disposed between two electrodes of the device and includes conductive nanoparticles that are distributed within an insulating matrix. The particles are distributed below the percolation threshold.

20 Claims, 4 Drawing Sheets

(56) References Cited

U.S. PATENT DOCUMENTS

| | | | |
|---|---|---|---|
| 2012/0051137 A1* | 3/2012 | Hung | G11C 16/0466 365/185.17 |
| 2012/0277377 A1* | 11/2012 | Kysar | B82Y 30/00 525/64 |
| 2013/0001502 A1* | 1/2013 | Jung | H01L 45/06 257/4 |
| 2013/0240821 A1 | 9/2013 | Toh et al. | |
| 2014/0065422 A1 | 3/2014 | Kim et al. | |
| 2014/0252332 A1* | 9/2014 | Carroll | B82Y 10/00 257/40 |
| 2014/0254245 A1* | 9/2014 | Tadepalli | G06F 12/0246 365/148 |
| 2014/0264224 A1* | 9/2014 | Zhang | H01L 45/144 257/2 |
| 2014/0264238 A1 | 9/2014 | Jo | |
| 2014/0299820 A1* | 10/2014 | Harandek | H01B 1/18 252/508 |
| 2015/0107660 A1* | 4/2015 | Kempa | H01L 31/02168 136/256 |
| 2015/0325290 A1* | 11/2015 | Lasser | G11C 13/0069 365/148 |
| 2015/0380477 A1* | 12/2015 | Huang | H01L 28/40 257/532 |
| 2016/0218285 A1* | 7/2016 | Wang | H01L 45/1608 |
| 2016/0260544 A1* | 9/2016 | Adiga | H01G 4/06 |
| 2016/0300883 A1* | 10/2016 | Bateman | H01L 27/2454 |
| 2017/0152439 A1* | 6/2017 | Lian | C09K 15/02 |
| 2017/0240752 A1* | 8/2017 | Banerjee | C09D 7/1216 |
| 2017/0271058 A1* | 9/2017 | Hellman | H01F 1/0054 |
| 2017/0309820 A1* | 10/2017 | Sandhu | H01L 45/1616 |

OTHER PUBLICATIONS

Crossbar Resistive Memory: The Future Technology for NAND Flash http://www.crossbar-inc.com/assets/resource/whitepaper/Crossbar-RRAM-Technology-Whitepaper.pdf.

Device structure and fabrication of the nonvolatile memory device http://www.nature.com/am/journal/v4/n6/full/am201232a.html.

Yun, et al; Effect of embedded metal nanocrystals on the resistive switching characteristics in NiN-based resistive random access memory cells; Journal of Applied Physics 115, 094305 (2014); doi: 10.1063/1.4867639 <http://dx.doi.org/10.1063/1.4867639>.

Liu, et al.; Resistive switching characteristics of a Pt nanoparticle-embedded $SiO_2$-based memory; Thin Solid Films 529 (2013) 107-110.

Juang, et al; Size-controlled platinum nanoparticles prepared by modified-version atomic layer deposition for ethanol oxidation; Journal of Power Sources 275 (2015) 845-851.

Hsieh, et al.; Platinum electrocatalysts attached to carbon nanotubes by atomic layer deposition with different cycle numbers; Journal of the Taiwan Institute of Chemical Engineers 45 (2014) 186-191.

Choi, et al; Electrical Performance and Scalability of Pt Dispersed $SiO_2$ Nanometallic Resistance Switch; American Chemical Society; Nano Letters 2013, 13, 3213?3217 <dx.doi.org/10.1021/nl401283q>.

Baek, et al.; Realization of Vertical Resistive Memory (VRRAM) using cost effective 3D Process; Process Development Team, CAE Team, and New Memory Lab, Semiconductor R&D Center, Samsung Electronics Co., Ltd. IEDM11 737-740.

* cited by examiner

NANO-PARTICLE MATRIX FOR 3D NVM RRAM

BACKGROUND OF THE DISCLOSURE

Field of the Disclosure

Embodiments of the present disclosure generally relate to a set of nano-particles distributed in a 3D non-volatile memory (NVM) resistive random access memory (RRAM) device.

Description of the Related Art

A number of different memory technologies exist today for storing information for use in computing systems. These different memory technologies may, in general, be split into two major categories, volatile memory and non-volatile memory. Volatile memory may generally refer to types of computer memory that requires power in order to retain stored data. Non-volatile memory, on the other hand, may generally refer to types of computer memory that do not require power in order to retain stored data. Examples of types of volatile memory include certain types of random access memory (RAM), such as dynamic RAM (DRAM) and static RAM (SRAM). Examples of types of non-volatile memory include read-only memory (ROM), flash memory, such as NOR and NAND flash, etc.

In recent years, there has been a demand for higher density (capacity) devices, which have relatively low cost per bit, for use in high capacity storage applications. Today, the memory technologies that generally dominate the computing industry are DRAM and NAND flash; however, these memory technologies may not be able to address the current and future capacity demands of next generation computing systems.

Recently, a number of emerging technologies have drawn increasing attention as potential contenders for the next generation memory type. Some of these emerging technologies include phase change memory (PCM), resistive RAM (known by both the acronym ReRAM or RRAM) and others. RRAM, which shares some similarities to PCM in that they both operate via mechanisms that have state-dependent resistance, is also a type of non-volatile memory technology that generally stores data using changes in electrical resistance.

Each of these different emerging memory technologies may be serious contenders to dislodge NOR and NAND flash memory in solid state storage applications and, in the case of NAND flash, solid-state drives (SSDs). As such, it may be desirable to provide techniques that may be used to achieve higher capacity in non-volatile memory while minimizing cost per bit.

SUMMARY OF THE DISCLOSURE

The present disclosure generally relates to a nano-particle distribution in a 3D NVM RRAM device. The RRAM device utilizes a material that may be deposited into high aspect ratio channels, has good cycle ability, short erase and write times, and write/erase voltages that are compatible with CMOS. The RRAM material is disposed between two electrodes of the device and includes conductive nano-particles that are distributed within an insulating matrix. The particles are spatially distributed below the percolation threshold.

In one embodiment, a non-volatile memory device comprises a first electrode; a second electrode; and a first memory material disposed between the first electrode and the second electrode, wherein the first memory material comprises an insulating material having a plurality of electrically conducting nano-particles distributed within the insulating material, wherein the nano-particles are distributed spatially in a manner such that a substantial number of the particles are distributed below the percolation threshold, and wherein the electrically conducting nano-particles are selected from the group consisting of the metals palladium, rhodium, ruthenium, platinum, nickel, gold, silver, aluminum, titanium, tungsten, zirconium, tin, molybdenum, chromium, tantalum, hafnium, zirconium, vanadium, and alloys thereof.

In another embodiment, a non-volatile memory device comprises a substrate; a first insulating layer disposed over the substrate; a first electrode layer disposed on the first insulating layer; a second insulating layer disposed on the first electrode layer; a second electrode layer disposed on the second insulating layer; a third insulating layer disposed on the second electrode layer, wherein a via or a trench is formed through the third insulating layer, the second electrode layer, the second insulating layer, the first electrode layer and the first insulating layer to expose a portion of the substrate; a memory material layer disposed within the via or trench, wherein the memory material comprises an insulating material having a plurality of metallic nano-particles distributed within the insulating material, wherein a majority of the nano-particles are distributed below the percolation threshold, and wherein the metallic nano-particles are selected from the group consisting of palladium, platinum, rhodium, ruthenium, nickel, gold, silver, aluminum, titanium, tungsten, zirconium, tin, molybdenum, chromium, tantalum, hafnium, vanadium, and alloys thereof; and at least one upper electrode disposed on the memory material layer.

In another embodiment, a method of manufacturing a non-volatile memory device comprises depositing a memory material over a first electrode, wherein the first memory material comprises an insulating material having a plurality of metallic nano-particles distributed within the insulating material, wherein a majority of the nano-particles are distributed below the percolation threshold, and wherein the metallic nano-particles are selected from the group consisting of palladium, platinum, rhodium, ruthenium, nickel, gold, silver, aluminum, titanium, tungsten, zirconium, tin, molybdenum, chromium, tantalum, hafnium, vanadium, and alloys thereof; and wherein the depositing comprises atomic layer deposition or chemical vapor deposition; and forming a second electrode over the memory material.

In another embodiment, a 3D non-volatile memory device comprises a plurality of conductive layers alternating with a plurality of insulating layers, wherein the plurality of conductive layers and plurality of insulating layers are disposed over a substrate, wherein a via or trench is formed through the plurality of conductive layers and plurality of insulating layers to expose the substrate; a memory material disposed within the via or trench along the plurality of conductive layers and the plurality of insulating layers, wherein the memory material comprises an insulating material having a plurality of metallic nano-particles distributed within the insulating material, wherein the nano-particles are distributed below the percolation threshold, and wherein the metallic nano-particles are selected from the group consisting of palladium, platinum, rhodium, ruthenium, nickel, gold, silver, aluminum, titanium, tungsten, zirconium, tin, molybdenum, chromium, tantalum, hafnium, vanadium, and alloys thereof; and a plurality of electrodes disposed on the memory material.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

The present disclosure generally relates to a nano-particle matrix in a 3D NVM RRAM device. The RRAM device utilizes a material that may be deposited into high aspect ratio channels, has good cycle ability, short erase and write times, and write/erase voltages that are compatible with CMOS. The RRAM material is disposed between two electrodes of the device and includes conductive nano-particles that are distributed within an insulating matrix. A majority of the nano-particles are distributed below the percolation threshold.

Figure 1:
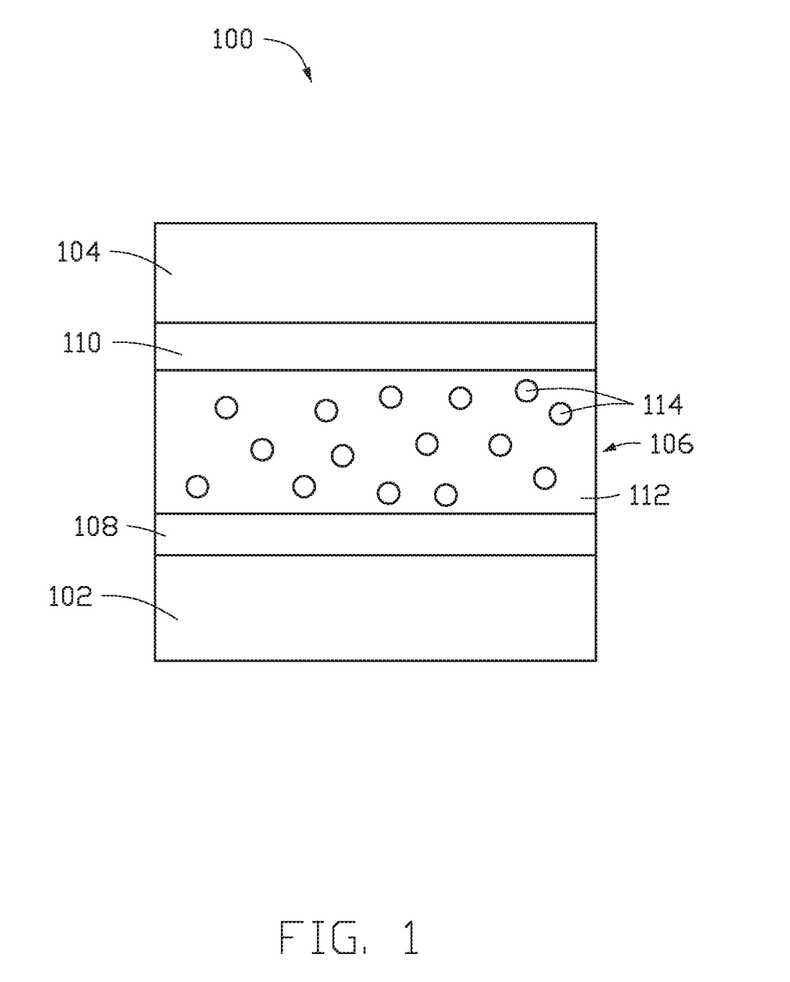
FIG. 1 is a schematic cross-sectional illustration of a storage device according to one embodiment.

FIG. 1 is a schematic cross-sectional illustration of a storage device 100 according to one embodiment. The storage device 100 includes a first electrode 102 and a second electrode 104. A memory material, such as a RRAM material layer 106 is disposed between the electrodes 102, 104. Nucleation layers 108, 110 may be present between the electrodes 102, 104 and the RRAM material layer 106. In one embodiment, the electrodes 102, 104 include electrically conductive materials such as copper, palladium, rhodium, ruthenium, nickel, gold, silver, aluminum, titanium, tungsten, zirconium, tin, molybdenum, chromium, tantalum, hafnium, vanadium, molybdenum, platinum, tantalum and alloys thereof.

The nucleation layers 108, 110 may be made of the same material as the particle 114 material. The nucleation layer has a surface topography may have a surface roughness which is larger on a surface perpendicular to an interface with the first electrode than a surface in contact with the first electrode or the nucleation layer may have a high density of defects in the surface. The nucleation layer may be other materials which have a surface energy which is less than the surface energy of the particle 114 material.

The RRAM material layer 106 comprises an insulating matrix 112 with a plurality of nano-particles 114 disposed therein. In one embodiment, the insulating matrix 112 includes insulating material selected from the group consisting of $SiO_x$, $SiN_x$, $AlO_x$, $AlN_x$, $TiN_x$, $TiO_x$, $TaO_x$, $TaN_x$, $WO_x$, $WN_x$, $ZrO_x$, and $HfO_x$, complex metal oxides, complex nitrides and complex oxynitrides. The nano-particles 114 may comprise metallic nano-particles that are elemental metals. The elemental metals may be selected from the group consisting of palladium, rhodium, ruthenium, nickel, gold, silver, aluminum, titanium, tungsten, zirconium, tin, molybdenum, chromium, tantalum, hafnium, vanadium, molybdenum, platinum, tantalum and alloys thereof.

The alloy of nano-particles 114 may be made of both metallic elements as well as in addition contain less electrically conducting elements. Examples of those less electrically conducting elements that can be part of the alloy include silicon, germanium, boron, nitrogen, oxygen. The composition of the nano-particles may be uniform or vary spatially thru the nano-particle. The spatial distribution of the composition may be regular or radial-dependent or non-uniform thru the thickness of the nano-particle. The nano-particles may have a composition or properties at the surface of the nano-particle which differ from the composition or properties in the interior or the nano-particle. Metallic and/or less electrically conducting elements may form a coating on the nano-particles that may differ in composition from the interior of the nano-particle. The nano-particles may have a variety of geometric shapes and the shape may be different and vary from nano-particle to nano-particle. The matrix in proximity to the nano-particles 114 can have a high or a low resistance for different memory states. The nano-particles 114 are distributed within the insulating matrix 112 with a majority of the nano-particles distributed spatially below the percolation threshold.

The percolation threshold is the least number of particles necessary to form a percolation network, and a percolation network is a network structure wherein unit particles are randomly arranged yet interconnected. For the percolation threshold, the threshold is a fraction of nano-particles sites in an array of possible nano-particles sites that are filled with nano-particles to create a continuous path of adjacent nano-particles extending from one side of a structure (in this case, layer 106) to another side of the structure with the nano-particles sites are filled in a random manner.

The description herein above is in regards to a general RRAM structure. It is to be understood that the general RRAM structure may be applicable to other RRAM devices such as those described below.

Figure 2:
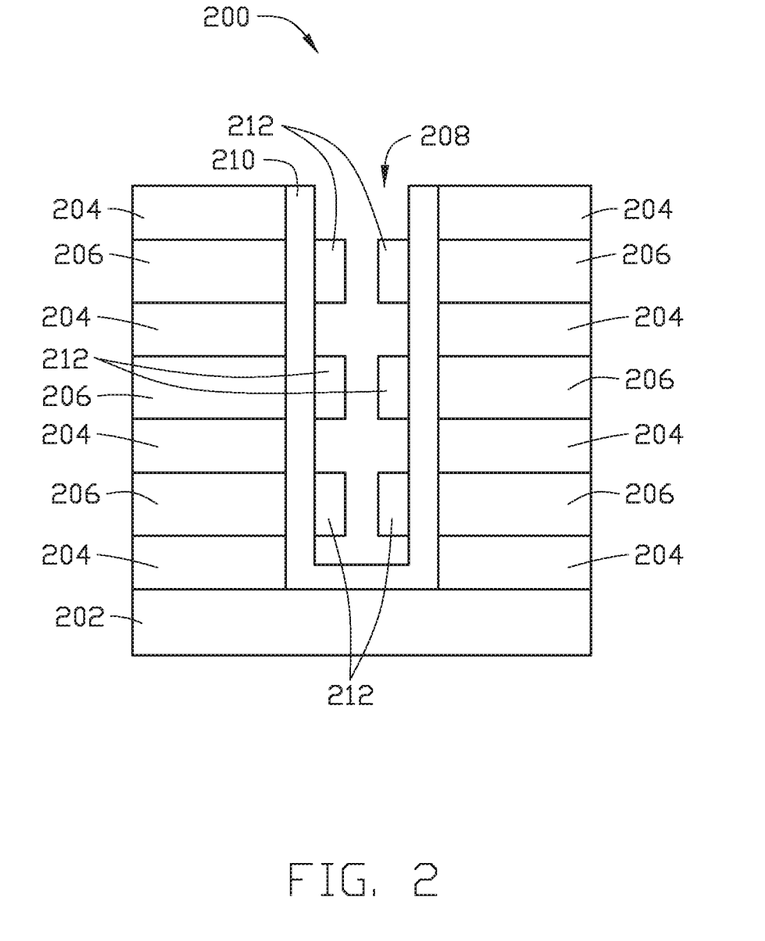
FIG. 2 is a schematic cross-sectional illustration of a 3D storage device according to one embodiment.

FIG. 2 is a schematic cross-sectional illustration of a 3D storage device 200 according to one embodiment. The device 200 includes a substrate 202 and alternating insulating layers 204 and conductive layers 206. The conducting layers 206 will operate as electrodes during device 200 operation. The substrate 202 may comprise any suitable material such as silicon, glass, plastic or any suitable semiconductor material. Furthermore, it is to be understood that the substrate 202 may comprise multiple layers such as a CMOS substrate. A single layer has been shown for ease of understanding.

The alternating insulating layers 204 and conductive layers 206 may be deposited successively utilizing well known techniques such as chemical vapor deposition (CVD), plasma enhanced CVD (PECVD), atomic layer deposition (ALD), physical vapor deposition (PVD), electroplating (in the case of the conductive layer 206), electroless plating (in the case of the conductive layer 206) or other suitable deposition techniques. Suitable materials that may be used for the insulating layers 204 include $SiO_x$, $SiN_x$, $AlO_x$, $AlN_x$, $TiN_x$, $TiO_x$, $TaO_x$, $TaN_x$, $WO_x$, $WN_x$, $ZrO_x$, and $HfO_x$, where x indicates the composition can be stoichiometric or non-stoichiometric. Suitable materials include complex oxides and nitrides which include more than one element in addition to oxygen or nitrogen and oxynitrides which include both oxygen and nitrogen as well as one or more additional elements. For example the insulating matrix may be $SiO_xN_y$, $TaO_xN_y$, $Ta_zSi_wO_xN_y$, and other multi-element systems, where x, y, z and w indicate composition. It is contemplated that other insulating materials that are typically utilized in CMOS structures may be utilized for the insulating layers 204. ALD and CVD are particularly well-suited for depositing materials in or on high-aspect-ratio features such as for 3D memory structures. The conductive layers 206 may comprise electrically conductive materials such as copper, palladium, rhodium, ruthenium, nickel, gold, silver, aluminum, titanium, tungsten, zirconium, tin, molybdenum, chromium, tantalum, hafnium, vanadium, molybdenum, platinum, tantalum and alloys thereof.

Following formation of the alternating insulating layers 204 and conductive layers 206, a via or trench 208 may be formed therethrough to expose the substrate 202. Thereafter, the RRAM material layer 210 may be deposited within the via or trench 208. In one embodiment, a nucleation layer (not shown) may be deposited into the via or trench 208 prior to deposition of the RRAM material layer 210. The RRAM material layer 210 may be deposited by ALD due to the high aspect ratio of the via or trench 208. In one embodiment, the aspect ratio may be 10:1 or more and may form part of a 3D memory structure. The RRAM material layer 210 includes the insulating matrix 112 with the plurality of nano-particles 114 disposed therein as discussed above in regards to FIG. 1. Over the RRAM material layer 210, electrodes 212 are formed. The electrodes 212 may comprise electrically conductive materials such as copper, palladium, rhodium, ruthenium, nickel, gold, silver, aluminum, titanium, tungsten, zirconium, tin, molybdenum, chromium, tantalum, hafnium, vanadium, platinum, tantalum and alloys thereof.

Figure 3:
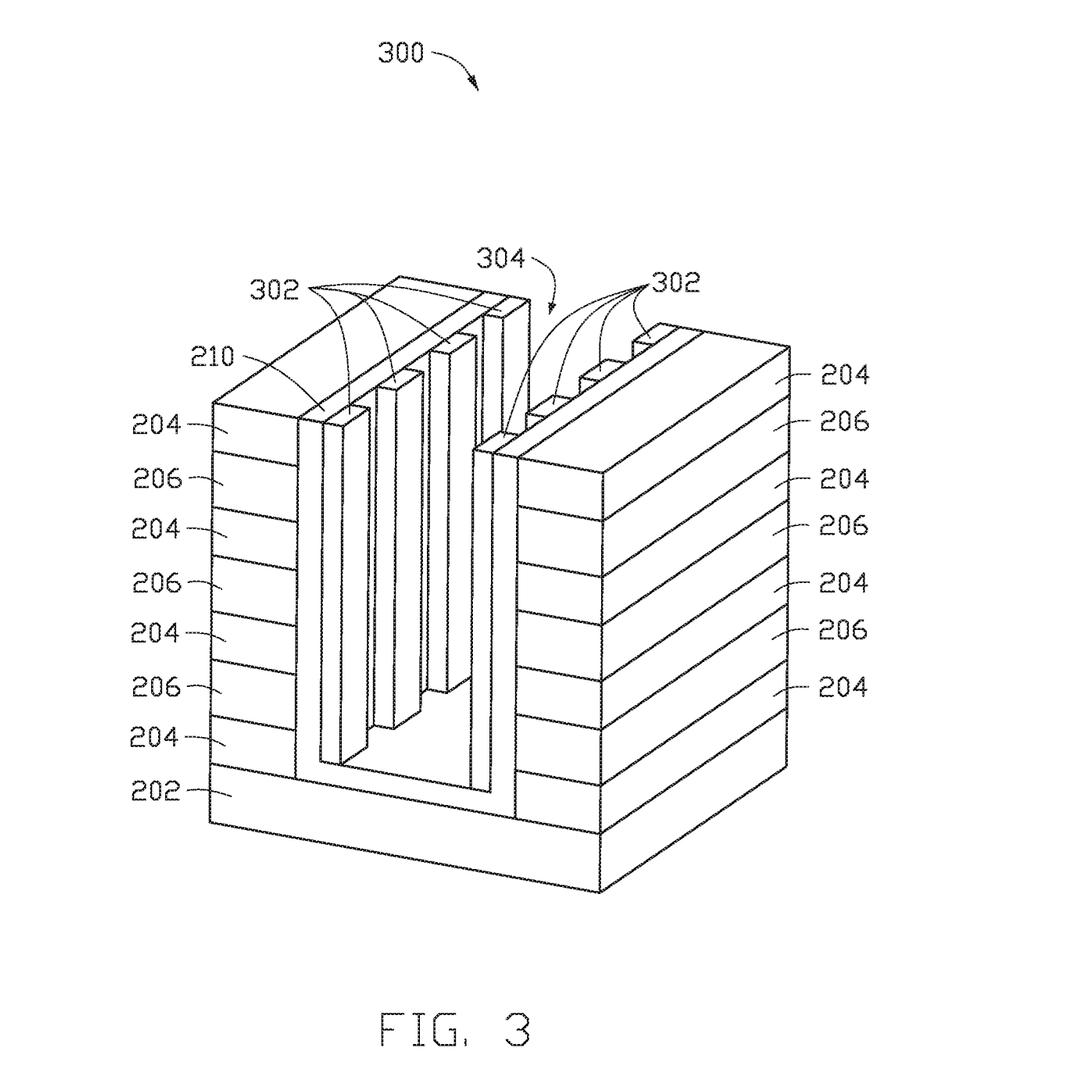
FIG. 3 is a schematic isometric illustration of a 3D storage device according to another embodiment.

FIG. 3 is a schematic isometric illustration of a 3D storage device 300 according to another embodiment. As shown in FIG. 3, a trench 304 is present within the alternating insulating layers 204 and conductive layers 206. Electrodes 320 that extend from the top of the trench 304 to the bottom of the trench 304 are present. It is contemplated that the electrodes 302 may extend horizontally along the trench 304. The electrodes 302 may comprise electrically conductive materials copper, palladium, rhodium, ruthenium, nickel, gold, silver, aluminum, titanium, tungsten, zirconium, tin, molybdenum, chromium, tantalum, hafnium, vanadium, platinum, tantalum and alloys thereof.

Figure 4:
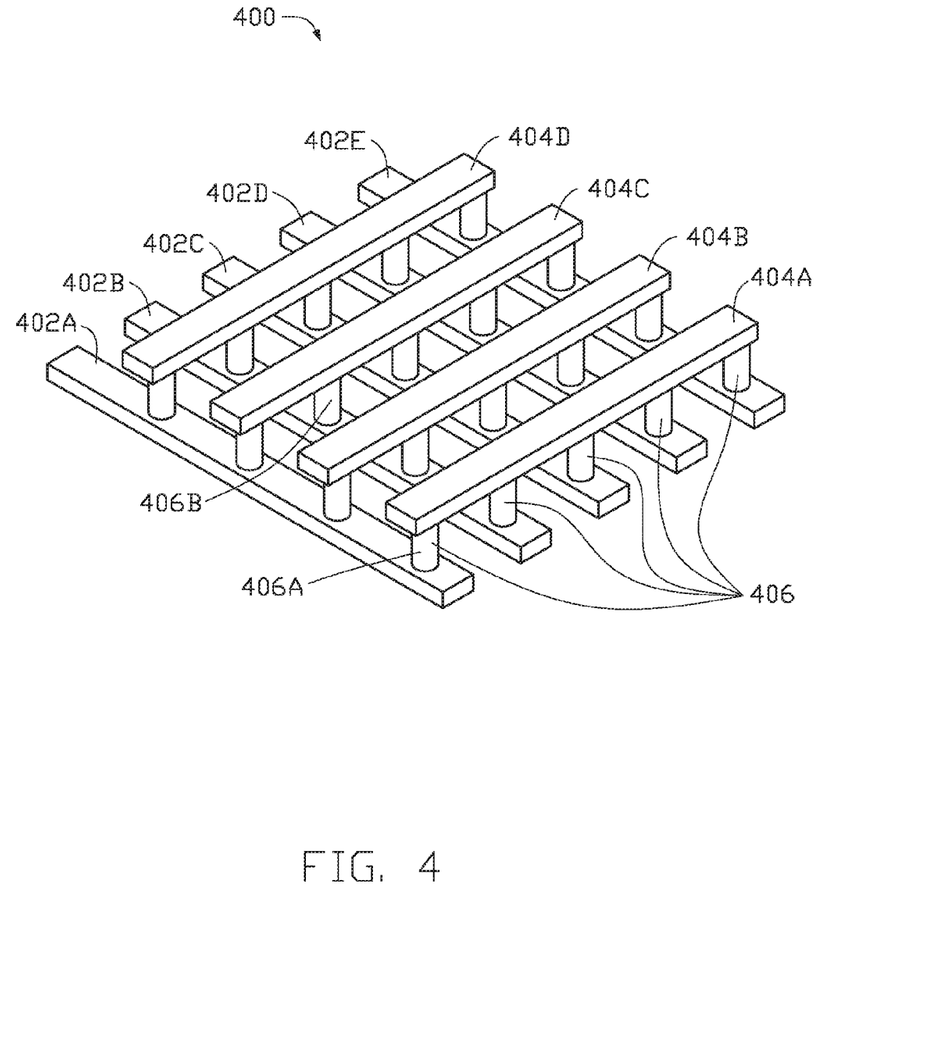
FIG. 4 is a schematic isometric illustration of a 3D storage device according to another embodiment.

FIG. 4 is a schematic isometric illustration of a 3D storage device 400 according to another embodiment. The device 400 includes first electrodes 402A-402E, second electrodes 404A-404D and memory elements 406. The memory elements 406 include the insulating matrix 112 with the plurality of nano-particles 114 disposed therein as discussed above in regards to FIG. 1.

The first electrodes 402A-402E are all disposed in a common plane and extend substantially parallel to on another. Conversely, the second electrodes 404A-404D are disposed in a plane different than the plane in which the first electrodes 402A-402E reside. However, similar to the first electrodes 402A-402E, the second electrodes 404A-404D are disposed in a common second plane and extend substantially parallel to one another. The second electrodes 404A-404D extend substantially perpendicular to the first electrodes 402A-402E. Both the first electrodes 402A-402E and the second electrodes 404A-404D may comprise electrically conductive materials such as copper, palladium, rhodium, ruthenium, nickel, gold, silver, aluminum, titanium, tungsten, zirconium, tin, molybdenum, chromium, tantalum, hafnium, vanadium, platinum, tantalum and alloys thereof.

As shown in FIG. 4, the memory elements 406 are substantially perpendicular to both the first electrodes 402A-402E and second electrodes 404A-404D. The 3D arrangement shown in FIG. 4 permits the individual memory elements 406 to be accessed. For example, by applying a current to electrodes 402A and 404A, one distinct memory element 406A is accessed. Similarly, by applying current to electrodes 402B and 404C, memory element 406B is accessed.

The memory material utilized in the 3D devices described herein is beneficial for achieve higher capacity in non-volatile memory while minimizing cost per bit. The use of material that has both high and low resistance allows for a high and low memory state. The materials for the insulating material, the materials and compositions of the nano-particles and the spatial dependence of the composition of the nano-particles, including any surface coatings on the nano-particles all affect the electrical tuning of the memory material layer. Thus, the memory material layer can be customized to meet the user's needs. Further, it is contemplated that different mixes of materials for the insulating material, materials for the nano-particles and spatial dependence of the geometries of the insulating material and the nano-particles may be utilized in different locations of the same memory material layer such that customized memory, within a memory device, is achieved.

While the foregoing is directed to embodiments of the present disclosure, other and further embodiments of the disclosure may be devised without departing from the basic scope thereof, and the scope thereof is determined by the claims that follow.

What is claimed is:

1. A non-volatile memory device, comprising:
   a first electrode;
   a second electrode; and
   a first memory material disposed between the first electrode and the second electrode, wherein the first memory material comprises an insulating material having a plurality of metallic nano-particles distributed within the insulating material, wherein the nano-particles are distributed below the percolation threshold, and wherein the metallic nano-particles are selected from the group consisting of palladium, platinum, rhodium, ruthenium, zirconium, tin, molybdenum, chromium, tantalum, hafnium, vanadium, and alloys, wherein the first memory material comprises nanoparticles having a composition on a surface of the nano-particles which differ from a composition in an interior of the nano-particles, the surface of the nano-particles comprising a material selected from the group consisting of silicon, germanium, boron, nitrogen, oxygen, palladium, platinum, rhodium, ruthenium, nickel, gold, silver, aluminum, titanium, tungsten, zirconium, tin, molybdenum, chromium, tantalum, hafnium, vanadium, and alloys thereof.

2. The non-volatile memory device of claim 1, wherein the first electrode is substantially perpendicular to the second electrode.

3. The non-volatile memory device of claim 1, further comprising:
   a third electrode extending substantially parallel to the first electrode;
   a fourth electrode extending substantially parallel to the second electrode;
   a second memory material disposed between the first electrode and the fourth electrode; and
   a third memory material disposed between the third electrode and the second electrode.

4. The non-volatile memory device of claim 3, wherein the second memory material and the third memory material each comprise an insulating material having a plurality of metallic nano-particles distributed within the insulating material, wherein the nano-particles are distributed below the percolation threshold, and wherein the metallic nano-particles are selected from the group consisting of palladium, platinum, rhodium, ruthenium, nickel, gold, silver, aluminum, titanium, tungsten, zirconium, tin, molybdenum, chromium, tantalum, hafnium, vanadium, and alloys thereof.

5. The non-volatile memory device of claim 1, further comprising a first nucleation layer disposed between the first electrode and the first memory material.

6. The non-volatile memory device of claim 5, wherein the nucleation layer comprises:
   the same material as the nano-particle material; or
   a different material than the nano-particle material; or
   a material having a lower surface energy than the nano-particle material; or
   the nucleation layer has a surface topography having a surface roughness which is larger on a surface perpendicular to an interface with the first electrode than a surface in contact with the first electrode; or
   the nucleation layer has a high density of defects in the surface facing the matrix.

7. A non-volatile memory device, comprising:
   a substrate;
   a first insulating layer disposed over the substrate;
   a first electrode layer disposed on the first insulating layer;
   a second insulating layer disposed on the first electrode layer;
   a second electrode layer disposed on the second insulating layer;
   a third insulating layer disposed on the second electrode layer, wherein a trench is formed through the third insulating layer, the second electrode layer, the second insulating layer, the first electrode layer and the first insulating layer to expose a portion of the substrate;
   a memory material layer disposed within the trench, wherein the memory material comprises an insulating material having a plurality of metallic nano-particles distributed within the insulating material, wherein a substantial number of the nano-particles are distributed below the percolation threshold, and wherein the metallic nano-particles are selected from the group consisting of palladium, platinum, rhodium, ruthenium, nickel, gold, silver, aluminum, titanium, tungsten, zirconium, tin, molybdenum, chromium, tantalum, hafnium, vanadium, and alloys thereof; and
   a plurality of upper electrodes disposed in physical contact on the memory material layer.

8. The non-volatile memory device of claim 7, wherein the insulating material is selected from the group consisting of $SiO_x$, $SiN_x$, $AlO_x$, $AlN_x$, $TiN_x$, $TiO_x$, $TaO_x$, $TaN_x$, $WO_x$, $WN_x$, $ZrO_x$, and $HfO_x$, complex oxides, complex nitrides, and complex oxynitrides.

9. The non-volatile memory device of claim 7, wherein the upper electrodes are substantially perpendicular to the first electrode and the second electrode.

10. The non-volatile memory device of claim 7, wherein the memory material layer is disposed within a trench.

11. The non-volatile memory device of claim 7, wherein the memory material comprises a dopant dispersed therein.

12. The non-volatile memory device of claim 11, wherein the nano-particles further comprise a material selected from the group consisting of silicon, germanium, boron, nitrogen, oxygen, palladium, platinum, rhodium, ruthenium, nickel, gold, silver, aluminum, titanium, tungsten, zirconium, tin, molybdenum, chromium, tantalum, hafnium, vanadium, and alloys thereof.

13. A method of manufacturing a non-volatile memory device, comprising:
   depositing a memory material over a first electrode, wherein the first memory material comprises an insulating material having a plurality of metallic nano-particles distributed within the insulating material, wherein the nano-particles are distributed below a percolation threshold, and wherein the metallic nano-particles are selected from the group consisting of palladium, platinum, rhodium, ruthenium, nickel, gold, silver, aluminum, titanium, tungsten, zirconium, tin, molybdenum, chromium, tantalum, hafnium, vanadium, and alloys thereof; and wherein the depositing comprises atomic layer deposition or chemical vapor deposition; and
   forming a plurality of upper electrodes in physical contact with the memory material.

14. The method of claim 13, wherein the memory material further comprises a non-metallic element.

15. The method of claim 13, wherein the insulating material is selected from the group consisting of $SiO_x$, $SiN_x$, $AlO_x$, $AlN_x$, $TiN_x$, $TiO_x$, $TaO_x$, $TaN_x$, $WO_x$, $WN_x$, $ZrO_x$, and $HfO_x$, complex oxides, complex nitrides, and complex oxynitrides.

16. A 3D non-volatile memory device, comprising:
   a plurality of conductive layers alternating with a plurality of insulating layers, wherein the plurality of conductive layers and plurality of insulating layers are disposed over a substrate, wherein a trench is formed through the plurality of conductive layers and plurality of insulating layers to expose the substrate;
   a memory material disposed within the trench along the plurality of conductive layers and the plurality of insulating layers, wherein the memory material comprises an insulating material having a plurality of metallic nano-particles distributed within the insulating material, wherein the nano-particles are distributed below a percolation threshold, and wherein the metallic nano-particles are selected from the group consisting of palladium, platinum, rhodium, ruthenium, nickel, gold, silver, aluminum, titanium, tungsten, zirconium, tin, molybdenum, chromium, tantalum, hafnium, vanadium, and alloys thereof; and a plurality of electrodes disposed in physical contact on the memory material.

17. The 3D non-volatile memory device of claim 16, wherein the insulating material is selected from the group consisting of $SiO_x$, $SiN_x$, $AlO_x$, $AlN_x$, $TiN_x$, $TiO_x$, $TaO_x$, $TaN_x$, $WO_x$, $WN_x$, $ZrO_x$, and $HfO_x$, complex oxides, complex nitrides, and complex oxynitrides.

18. The 3D non-volatile memory device of claim 16, further comprising a first nucleation layer disposed between the plurality of conductive layers and the memory material.

19. The 3D non-volatile memory device of claim 18, wherein the nucleation layer comprises the same material as the nano-particle material or a different material than the nano-particle material or a material having a lower surface energy than the nano-particle material or the nucleation layers may have a surface topography having a surface roughness which is larger on the side facing layer than the opposite sides facing materials or may have a high density of defects in their surface.

20. The 3D non-volatile memory device of claim 18, wherein the memory material comprises nano-particles having a composition or properties on the surface of the nano-particles which differ from the composition or properties in the interior of the nano-particles.

* * * * *